US012666633B2

(12) United States Patent (10) Patent No.: US 12,666,633 B2
Asano et al. (45) Date of Patent: Jun. 23, 2026

(54) SIGNAL TRANSMISSION DEVICE

(71) Applicant: DENSO CORPORATION, Kariya-city (JP)

(72) Inventors: Shuji Asano, Kariya-city (JP); Koichi Yako, Kariya-city (JP); Akira Yamada, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 391 days.

(21) Appl. No.: 18/394,881

(22) Filed: Dec. 22, 2023

(65) Prior Publication Data

US 2024/0128309 A1 Apr. 18, 2024

Related U.S. Application Data

(63) Continuation of application No. PCT/JP2022/032257, filed on Aug. 26, 2022.

(30) Foreign Application Priority Data

Aug. 30, 2021 (JP) ................................. 2021-139939

(51) Int. Cl.
| | |
|---|---|
| *H10D 1/68* | (2025.01) |
| *H10W 42/60* | (2026.01) |
| *H10W 70/65* | (2026.01) |
| *H10W 70/685* | (2026.01) |
| *H10W 72/00* | (2026.01) |

(Continued)

(52) U.S. Cl.
CPC ............ *H10D 1/692* (2025.01); *H10W 42/60* (2026.01); *H10W 70/65* (2026.01); *H10W 70/685* (2026.01); *H10W 90/00* (2026.01);

*H10W 72/07252* (2026.01); *H10W 72/07352* (2026.01); *H10W 72/221* (2026.01);
(Continued)

(58) Field of Classification Search
CPC .... H10D 1/692; H10W 42/60; H10W 70/685; H10W 90/00; H10W 70/65
See application file for complete search history.

(56) References Cited

U.S. PATENT DOCUMENTS

| | | |
|---|---|---|
| 10,366,958 B2 | 7/2019 | Bonifield et al. |
| 2015/0137314 A1* | 5/2015 | Osada ................... H01F 27/288 |
| | | 257/531 |

(Continued)

FOREIGN PATENT DOCUMENTS

JP 2001-203277 A 7/2001

*Primary Examiner* — Christine A Enad
(74) *Attorney, Agent, or Firm* — Posz Law Group, PLC

(57) ABSTRACT

A signal transmission device having a capacitor coupler includes a semiconductor substrate, a low voltage circuit region, an insulating film formed on the semiconductor substrate, a lower electrode formed on the semiconductor substrate via the insulating film, and an upper electrode disposed opposite to the lower electrode via the insulating film interposed therebetween. A shield portion includes a conductor to which a low voltage is applied is provided between the lower electrode and the upper electrode and the low voltage circuit region. When a stacking direction of the lower electrode and the upper electrode is defined as a height direction, the shield portion is located higher than the low voltage circuit region and has an eaves part extending on an opposite side with respect to the lower electrode and the upper electrode.

9 Claims, 11 Drawing Sheets

(51) Int. Cl.
  *H10W 72/20*   (2026.01)
  *H10W 72/30*   (2026.01)
  *H10W 90/00*   (2026.01)

(52) U.S. Cl.
  CPC ........ *H10W 72/321* (2026.01); *H10W 90/722*
    (2026.01); *H10W 90/724* (2026.01); *H10W*
              *90/732* (2026.01)

(56)      References Cited

U.S. PATENT DOCUMENTS

2019/0206981 A1\* 7/2019 Bonifield ............... H10D 1/692
2024/0021598 A1\* 1/2024 Tanaka ................... H02M 1/08
2025/0062256 A1\* 2/2025 Asano ................... H10D 1/692

\* cited by examiner

SIGNAL TRANSMISSION DEVICE

CROSS REFERENCE TO RELATED APPLICATIONS

This application is a continuation application of International Patent Application No. PCT/JP2022/032257 filed on Aug. 26, 2022, which designated the U.S. and based on and claims the benefits of priority of Japanese Patent Application No. 2021-139939 filed on Aug. 30, 2021. The entire disclosure of all of the above applications is incorporated herein by reference.

TECHNICAL FIELD

The present disclosure relates to a signal transmission device having a capacitor coupler.

BACKGROUND

Conventionally, a signal transmission device has a capacitor coupler that electrically isolates and separates a high voltage circuit and a low voltage circuit and transmits a signal between them.

SUMMARY

An object of the present disclosure is to provide a signal transmission device having a capacitor coupler having a structure that more reliably suppresses an influence of a high electric field on a control circuit.

A signal transmission device having a capacitor coupler in one aspect of the present disclosure includes a semiconductor substrate, a low voltage circuit region having a control circuit configured to operate based on a reference potential of low voltage formed in the semiconductor substrate, an insulating film formed on the semiconductor substrate, a lower electrode formed on the semiconductor substrate via the insulating film and to which a control signal from the control circuit is output, an upper electrode disposed opposite to the lower electrode via the insulating film interposed therebetween, forming a capacitor together with the lower electrode and to which a high voltage higher than the low voltage is applied, and a shield portion formed at least in the insulating film, disposed between the lower electrode and the upper electrode, and the low voltage circuit region, and having a conductor to which a voltage applied in a control circuit operation is applied from the low voltage.

When a stacking direction of the lower electrode and the upper electrode is defined as a height direction, the shield portion is located higher than the low voltage circuit region and has an eaves part extending on an opposite side with respect to the lower electrode and the upper electrode.

DETAILED DESCRIPTION

Figure 1:
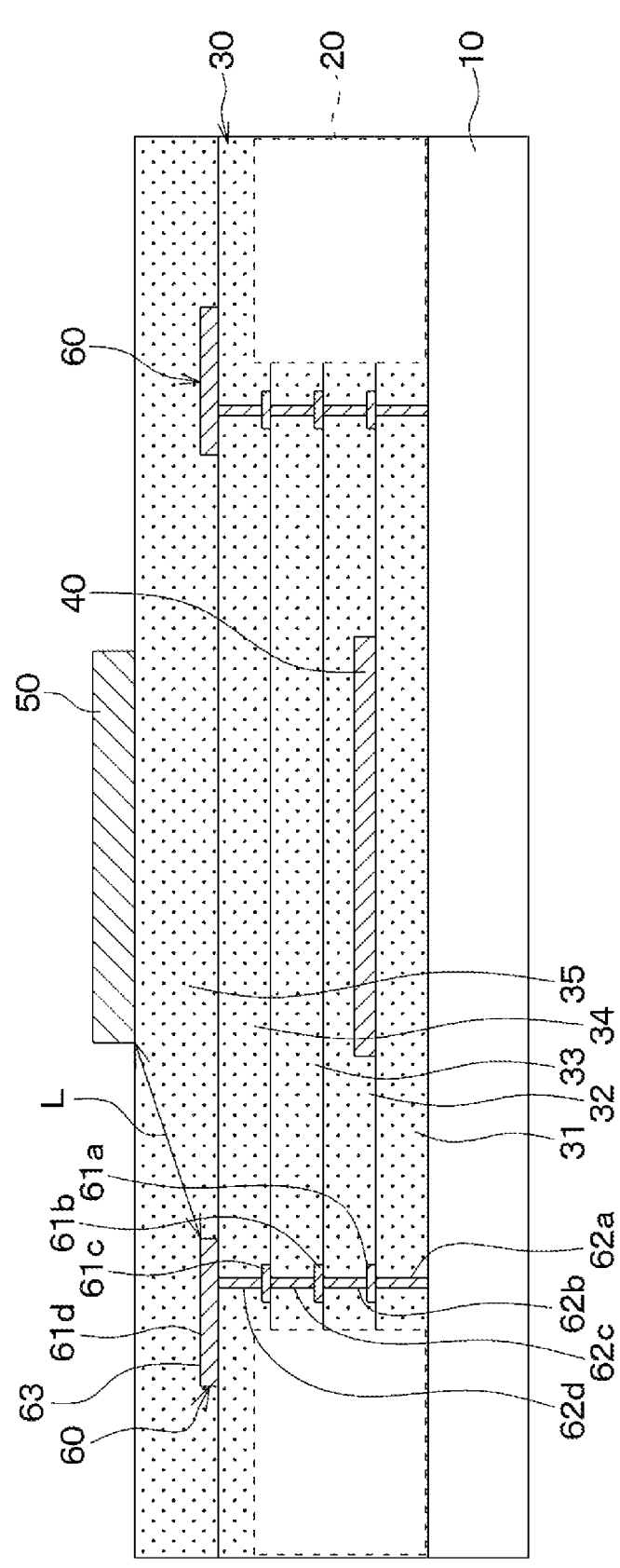
FIG. 1 is a partial cross-sectional view of a signal transmission device having a capacitor coupler according to a first embodiment.

In an assumable example, a signal transmission device has a capacitor coupler that electrically isolates and separates a high voltage circuit and a low voltage circuit and transmits a signal between them. For example, a signal transmission device includes a capacitor coupler configured with a lower electrode on the low voltage side and an upper electrode on the high voltage side with an insulating film interposed therebetween. This signal transmission device includes a shield portion in which conductive vias and conductive interconnect structures are alternately and repeatedly stacked in multiple stages between the capacitor coupler and peripheral elements provided around the capacitor coupler so that application of a high electric field to the peripheral elements is suppressed.

When the signal transmission device having the capacitor coupler is used for on/off control of a power switching element that controls a high voltage driven motor or the like, a high electric field of 1 kVrms is applied between an upper electrode and a lower electrode. When such a high electric field is applied, a high electric field is also applied around the capacitor coupler. For this reason, with only a shield portion in which conductive vias and conductive interconnect structures are alternately and repeatedly stacked in multiple stages, a high electric field wraps around from above the shield portion and affects a control circuit made up of peripheral elements. For example, when a memory is provided as the peripheral element, a high electric field causes negative charge to leak, causing a problem in that a memory function cannot be achieved. Further, wiring noise may be generated due to the high electric field. An object of the present disclosure is to provide a signal transmission device having a capacitor coupler having a structure that can more reliably suppress an influence of a high electric field on a control circuit.

A signal transmission device having a capacitor coupler in one aspect of the present disclosure includes
  a semiconductor substrate,
  a low voltage circuit region having a control circuit configured to operate based on a reference potential of low voltage formed in the semiconductor substrate,
  an insulating film formed on the semiconductor substrate,
  a lower electrode formed on the semiconductor substrate via the insulating film and to which a control signal from the control circuit is output,
  an upper electrode disposed opposite to the lower electrode via the insulating film interposed therebetween, forming a capacitor together with the lower electrode and to which a high voltage higher than the low voltage is applied, and
  a shield portion formed at least in the insulating film, disposed between the lower electrode and the upper electrode, and the low voltage circuit region, and having a conductor to which a voltage applied in a control circuit operation is applied from the low voltage.

When a stacking direction of the lower electrode and the upper electrode is defined as a height direction, the shield portion is located higher than the low voltage circuit region and has an eaves part extending on an opposite side with respect to the lower electrode and the upper electrode.

In this way, the shield portion has a structure in which an eaves part is provided. The eaves part made of a conductor extends in the direction opposite to the lower electrode and the upper electrode, that is, in a direction above the control circuit. Therefore, the eaves part prevents the high electric field from entering the low voltage circuit region where the control circuit is arranged, and thereby suppresses the influence on the control circuit and the like.

Hereinafter, embodiments of the present disclosure will be described with reference to the drawings. In the following embodiments, the same or equivalent parts are denoted by the same reference numerals.

First Embodiment

A first embodiment will be described. A signal transmission device having a capacitor coupler described in the present embodiment is used, for example, to control a power switching element used to drive a motor, etc., and is constructed by integrating the capacitor coupler together with low voltage side and high voltage side control circuits on one chip. For example, a chip on which a low-voltage side control circuit, a capacitor coupler, etc. are formed, and a chip on which a high-voltage side control circuit, a capacitor coupler, a drive circuit for a power switching element, etc. are formed are provided as separate chips. The capacitor coupler of the low voltage side chip and the capacitor coupler of the high voltage side chip are connected to each other, and when a signal is output from the low-voltage side control circuit, the signal is transmitted through each capacitor coupler. Based on this signal transmission, the power switching element is driven through the drive circuit provided in the chip on the high voltage side. In the following explanation, the capacitor coupler formed on the chip on the low voltage side will be used as an example, but the capacitor coupler on the high voltage side can also have the same structure as the capacitor coupler on the low voltage side.

As shown in FIG. 1, the signal transmission device includes a low voltage circuit region 20 on a semiconductor substrate 10, and a capacitor coupler configured with a lower electrode 40 and an upper electrode 50 with an insulating film 30 interposed on the low voltage circuit region 20. Further, a shield portion 60 is provided between the lower electrode 40 and the upper electrode 50 and the low voltage circuit region 20 to partition them.

The semiconductor substrate 10 is made of, for example, a silicon substrate, and peripheral elements included in the low voltage circuit region 20, such as IGBTs (Insulated Gate Bipolar Transistors) and MOSFETs, are built into the semiconductor substrate 10.

The low voltage circuit region 20 is a region in which a control circuit for controlling a drive target on a high voltage side, such as a power switching element and its drive circuit, is formed. The control circuit provided in the low voltage circuit region 20 is driven using a low voltage reference voltage, for example, a ground potential (hereinafter referred to as GND) as a reference. Although details of the control circuit are not described here, the peripheral elements are formed by performing a semiconductor manufacturing process on the semiconductor substrate 10, and wiring portions connected to the peripheral elements are patterned in the insulating film 30 to form an integrated circuit. The peripheral elements that constitute the control circuit include memory, etc. When the signal transmission device is shipped, data is written by injecting negative charge into the memory, and the signal transmission device is adjusted to perform the desired operation.

The insulating film 30 has a stacked structure of multiple layers. Here, an example will be described in which the insulating film 30 has a five-layer structure of a first film 31 to a fifth film 35, but the number of stacked layers is arbitrary. The first film 31 is formed on a surface of the semiconductor substrate 10, and the lower electrode 40 is formed on the first film 31. Further, the second film 32 to the fifth film 35 are formed between the lower electrode 40 and the upper electrode 50.

The first film 31 to the fifth film 35 are made of the same insulating material, but may be made of different materials. Here, the first film 31 to the fifth film 35 are made of TEOS (tetraethoxysilane).

The thickness of the first film 31 to the fifth film 35 is arbitrary, but the thickness of the second film 32 to the fifth film 35 is determined by setting a distance between the lower electrode 40 and the upper electrode 50. Further, in the case of the present embodiment, the film thicknesses of the first film 31 to the fourth film 34 are determined by setting the height of the shield portion 60 and the like.

The total thickness of the second film 32 to the fifth film 35 determines the height of the lower electrode 40 and the upper electrode 50, with the stacking direction of the lower electrode 40 and the upper electrode 50 being the height direction. The total thickness of the second film 32 to fifth film 35 determines a capacitance value of the capacitor constituted by the lower electrode 40 and the upper electrode 50. Therefore, the film thicknesses of the second film 32 to the fifth film 35 are determined depending on the required capacitance value. For example, the thicknesses of the second to fifth films 32 to 35 are set so that a distance between the lower electrode 40 and the upper electrode 50 is 4 to 10 μm, preferably 5 to 8 μm.

Further, the first film 31 to the fourth film 34 are alternately and repeatedly formed with conductors 61a to 61d, which will be described later, forming the shield portion 60. In the case of the present embodiment, the total thickness of the first film 31 to fourth film 34 is the height of the shield portion 60. The thickness of each of the first film 31 to fourth film 34 is set to a thickness that allows the vias 62a to 62d, which constitute the shield portion 60 together with the conductors 61a to 61d, to be satisfactorily embedded.

The lower electrode 40 is one electrode of a capacitor that constitutes a capacitor coupler. The lower electrode 40 is formed on the first film 31, and is electrically connected to a desired part in the control circuit through a lead wire 41 shown in FIG. 2, which is also formed on the first film 31. By outputting a signal from the control circuit to the lower electrode 40, a signal transmission is performed between the lower electrode 40 and the upper electrode 50. Since the lower electrode 40 receives a control signal from the control circuit that operates based on a low reference voltage, a low voltage is applied thereto.

Figure 2:
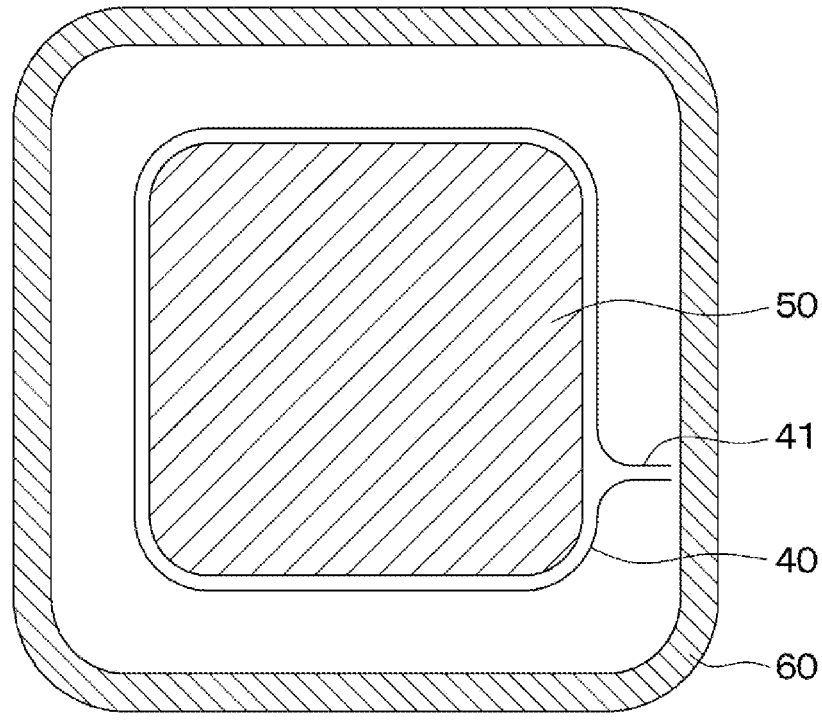
FIG. 2 is a top view of the capacitor coupler and a shield portion in FIG. 1.

As shown in FIG. 2, the lower electrode 40 has, for example, a rectangular shape with rounded corners, each side measuring 50 to 600 μm, and a thickness of 0.2 to 1 μm. The constituent material of the lower electrode 40 may be any metal as long as it is an electrode material, such as Al (aluminum), W (tungsten), Cu (copper), Ti (titanium), Ta (tantalum) or the like can be used.

As shown in FIG. 2, the upper electrode 50 has a rectangular shape with rounded corners and a side of 50 to 600 μm, and is thicker than the lower electrode 40 and has a thickness of, for example, 3 to 5 μm. The upper electrode 50 is formed on the lower electrode 40 via the second film 32 to the fifth film 35. The upper electrode 50 is arranged to face the lower electrode 40, and in the present embodiment, the upper electrode 50 is smaller than the lower electrode 40 in the dimensions shown in FIG. 2 when viewed from above, that is, the dimensions in a plane direction.

It is preferable that each side of the rectangle formed by the upper electrode 50 and each side of the rectangle formed by the lower electrode 40 are arranged in parallel, and that a center position of the upper electrode 50 and a center position of the lower electrode 40 coincide. However, each side of the rectangle formed by the upper electrode 50 and each side of the rectangle formed by the lower electrode 40 may not be arranged in parallel. Further, as long as the upper electrode 50 is located inside the lower electrode 40 when viewed from a normal direction to the upper surface of the upper electrode 50, the center position of the upper electrode 50 and the center position of the lower electrode 40 do not need to coincide. The constituent material of the upper electrode 50 may be any metal as long as it is an electrode material; for example, Al, W, Cu, Ti, Ta, etc. can be used. The constituent materials of the upper electrode 50 and the lower electrode 40 may be the same material or different materials.

By performing wire bonding (not shown) on the surface of the upper electrode 50, the upper electrode 50 is electrically connected to a chip provided with a drive circuit for a power switching element provided externally. Since the upper electrode 50 is connected to the drive circuit or the like that operates at a reference voltage higher than the low voltage referenced by the low voltage circuit region 20, a high voltage is applied thereto.

The shield portion 60 is formed at least within the insulating film 30 and is for suppressing the influence of the high electric field applied to the capacitor coupler on peripheral elements provided in the low voltage circuit region 20. The shield portion 60 is connected to a voltage applied during control circuit operation from low voltage, for example, the reference potential point of the low voltage circuit region 20, here the GND potential point which is the potential of the semiconductor substrate 10. In the present embodiment, as shown in FIG. 2, the shield portion 60 is arranged completely to surround the lower electrode 40 and the upper electrode 50 that constitute the capacitor coupler.

As shown in FIG. 1, the shield portion 60 includes the conductors 61a to 61d and the vias 62a to 62d. The conductors 61a to 61d are provided on each surface of the first film 31 to the fourth film 34, and are formed by forming a conductive material on each surface of the first film 31 to the fourth film 34 and then patterning the conductive material. The vias 62a to 62d are formed by burying a conductive material, for example, a part of the constituent material of the conductors 61a to 61d, into via holes formed in the first film 31 to the fourth film 34. The shield portion 60 is constructed by stacking and connecting these conductors 61a to 61d and vias 62a to 62d in the height direction.

A part of the conductors 61a to 61d included in the shield portion 60, here the conductor 61d in the uppermost layer closest to the upper electrode 50, is located at a position higher than the low voltage circuit region 20, specifically, at a position higher than the peripheral elements included in the low voltage circuit region 20. Then, the conductor 61d located higher than the peripheral elements are used as an eaves part 63, and the eaves part 63 protrudes more than the other conductors 61a to 61c on the opposite side with respect to the lower electrode 40 and the upper electrode 50, and covers the upper side of the peripheral elements. Regarding the eaves part 63, it is sufficient that the width thereof, that is, a distance from the end nearer to the lower electrode 40 and the upper electrode 50 to the end farthest from the lower electrode 40 and the upper electrode 50, is longer than that of the conductors 61a to 61c other than the eaves part 63. However, it is preferable that the width thereof is 10 μm or more.

Further, although the shield portion 60 can be arranged at any location, a shortest distance L from the upper electrode 50 to the shield portion 60 is set to be longer than the distance from the upper electrode 50 to the lower electrode 40. Preferably, the shortest distance L is 13 μm or more.

As described above, a signal transmission device having a capacitor coupler constituted by a capacitor formed by the lower electrode 40 and the upper electrode 50 is constructed. In the signal transmission device configured in this way, a control circuit (not shown) outputs a control signal to the lower electrode 40, and the control signal is transmitted to the upper electrode 50 and then transmitted to the external chip through the bonding wire. Thereby, the drive circuit provided in the external chip drives the power switching element based on the control signal from the control circuit. Therefore, it becomes possible to drive a motor and the like.

In the signal transmission device having such a capacitor coupler, a high electric field of, for example, 1 kVrms is applied between the lower electrode 40 and the upper electrode 50. Further, when determining whether the product is good or bad by screening before shipping the product, a high electric field of 3 kVrms is applied between the lower electrode 40 and the upper electrode 50. When these high electric fields are applied, high electric fields are also applied around the capacitor coupler.

For this reason, with only a shield portion in which conductive vias and conductive interconnect structures are alternately and repeatedly stacked in multiple stages, as shown in Patent Document 1, a high electric field wraps around from above the shield portion and affects a control circuit made up of peripheral elements. For example, when a memory is provided as the peripheral element, a high electric field causes negative charge to leak, causing a problem in that a memory function cannot be achieved. Further, wiring noise may be generated due to the high electric field.

On the other hand, in the present embodiment, the shield portion 60 has a structure in which the eaves part 63 is provided, and the eaves part 63 made of the conductor 61*d* is extended toward the upper side of the control circuit. Therefore, the eaves part 63 prevents the high electric field from entering the low voltage circuit region 20 where the control circuit is arranged, and thereby suppresses the influence on the control circuit and the like.

Figure 3:
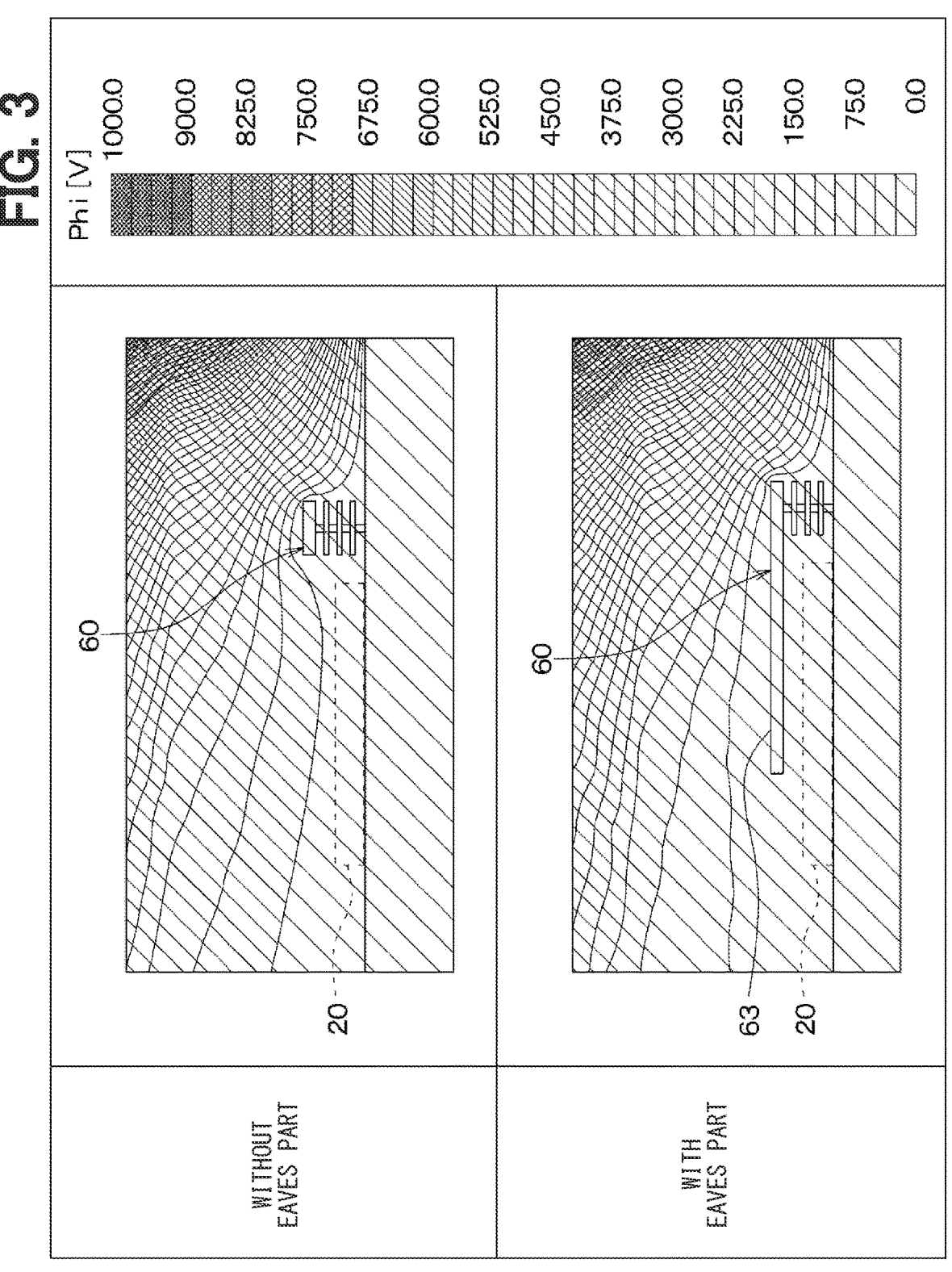
FIG. 3 is a diagram showing results of investigating how an electric field is applied near the capacitor coupler in cases where an eaves part is not provided and when an eaves part is provided.
Figure 4:
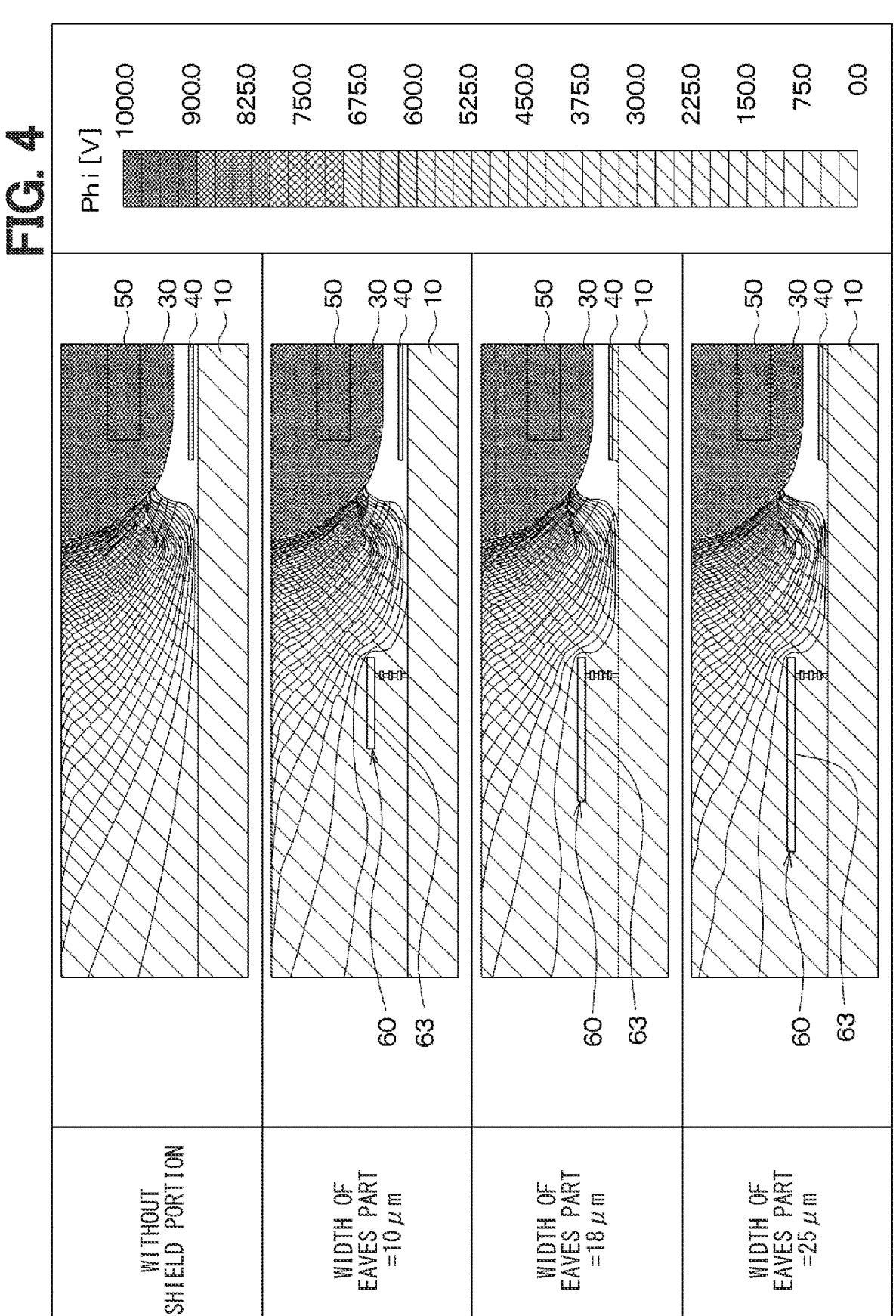
FIG. 4 is a diagram showing results of investigating how an electric field is applied near the capacitor coupler in a case where the shield portion is not provided and in a case where the shield portion is provided and a width of the eaves part is changed.

FIG. 3 shows the results of investigating how an electric field is applied near the capacitor coupler when the shield portion 60 is not provided with the eaves part 63 and when it is provided with the eaves part 63. FIG. 4 shows the results of investigating how the electric field is applied near the capacitor coupler when there is no shield portion 60 and when the shield portion 60 is provided and the width of the eaves part 63 is changed to 10 μm, 18 μm, and 25 μm. As shown in these figures, when there is no shield portion 60, the high electric field is applied to the low voltage circuit region 20, but in the structure including the shield portion 60, the high electric field is repelled by the shield portion 60.

At this time, as shown in FIG. 3, when the shield portion 60 does not have a structure that does not include the eaves part 63, that is, does not have a structure that extends above the low voltage circuit region 20, the high electric field is wraps around the low voltage circuit region 20 side. However, as shown in FIG. 4, when the shield portion 60 is provided with the eaves part 63, the high electric field is prevented from going around to the low voltage circuit region 20 side. For example, when the width of the eaves part 63 is 10 μm, the high electric field slightly wraps around to the low voltage circuit region 20 side, but hardly wraps around thereto. Furthermore, when the width of the eaves part 63 is 18 μm or 25 μm, the high electric field did not wrap around to the low voltage circuit region 20 side at all. Although not shown here, simulations were performed in which the width of the eaves part 63 and the distance between the lower electrode 40 and the upper electrode 50 were changed. When the width of the eaves part 63 is 10 μm or more, the wraparound of the high electric field to the low voltage circuit region 20 side was generally suppressed. In particular, when the width of the eaves part 63 was set to 20 to 40 μm, a state was created in which the high electric field almost did not wrap around to the low voltage circuit region 20 side.

In this manner, by providing the shield portion 60 with the eaves part 63, it is possible to suppress the high electric field from wrapping around to the low voltage circuit region 20 side, and it is also possible to suppress the influence on the control circuit and the like. As a result, for example, in the case where a memory is provided as the peripheral element, occurrence of negative charge leakage due to a high electric field is suppressed, and the memory function is suppressed from being unable to be performed. Furthermore, generation of wiring noise due to high electric fields can also be suppressed.

Furthermore, since the shield portion 60 is at the same potential as the lower electrode 40, here the GND potential, when the distance from the upper electrode 50, which is on the high voltage side, is too short, electric field concentration may occur at a position of the shield portion 60 closest to the upper electrode 50. Therefore, the shortest distance L is made longer than the distance from the upper electrode 50 to the lower electrode 40. Thereby, charge concentration at the position of the shield portion 60 closest to the upper electrode 50 can be alleviated.

Figure 5:
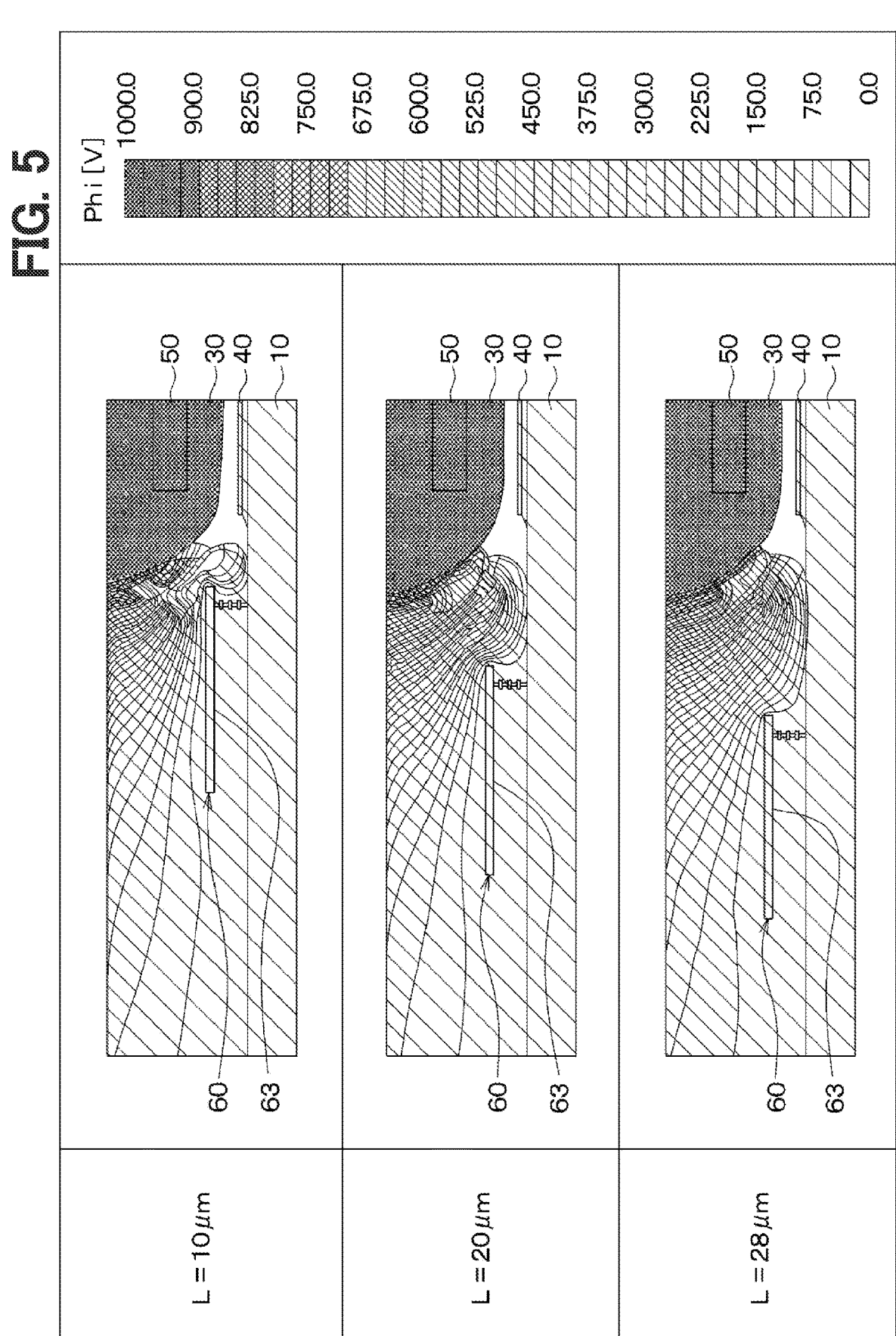
FIG. 5 is a diagram showing results of investigating how an electric field is applied near the capacitor coupler when a shortest distance L from an upper electrode to the shield portion is changed.

FIG. 5 shows the results of investigating how the electric field is applied near the capacitor coupler when the width of the eaves part 63 is 25 μm and the shortest distance L is changed to 10 μm, 20 μm, and 28 μm. As shown in this figure, even when the shortest distance L is 10 μm, the high electric field is generally prevented from wrapping around to the low voltage circuit region 20 side. When the shortest distance L are 20 μm or 28 μm, the high electric field did not wrap around to the low voltage circuit region 20 side at all.

Here, the measurement results are shown when the width of the eaves part 63 is 25 μm, but similar measurement results were obtained even when the width was changed. Analysis of each measurement result shows that when the distance between the lower electrode 40 and the upper electrode 50 is set to 4 to 10 μm, when the shortest distance L is 13 μm or more, almost no high electric field wrapped around to the low voltage circuit region 20 side. When the distance between the lower electrode 40 and the upper electrode 50 is set to 10 μm or more, it becomes more difficult for the high electric field to wrap around to the low voltage circuit region 20 side. Therefore, when the distance between the lower electrode 40 and the upper electrode 50 is 4 μm or more, it is sufficient that the shortest distance L is 13 μm or more. Therefore, it is preferable that the shortest distance L is 13 μm or more.

Furthermore, in the present embodiment, the upper electrode 50 is made thicker than the lower electrode 40. When a potential difference is generated between the lower electrode 40 and the upper electrode 50, electric field concentration occurs at the lower end of the upper electrode 50, which is on the lower electrode 40 side, and the upper end, which is on the opposite side to the lower electrode 40. When the upper electrode 50 is thin, the electric field concentration points at the upper and lower ends of the upper electrode 50 are closer together so that dielectric breakdown due to electric field concentration is likely to occur. On the other hand, when the thickness of the upper electrode 50 is made thicker than the lower electrode 40, the points where the electric field is concentrated can be separated. Therefore, it is possible to prevent the electric field concentration generated at the upper end and the lower end of the upper electrode 50 from overlapping and to alleviate the electric field concentration, thereby making it possible to further suppress dielectric breakdown due to the electric field concentration.

Modification of First Embodiment

In the first embodiment, the case where the eaves part 63 is constituted by the conductor 61*d* located at the highest position of the shield portion 60 is given as an example, but the eaves part 63 may not be constituted at the highest position. Furthermore, although a case has been shown in which the shield portion 60 has a four-layer structure including the conductors 61*a* to 61*d* and the vias 62*a* to 62*d*, the number of layers is arbitrary.

Figure 6A:
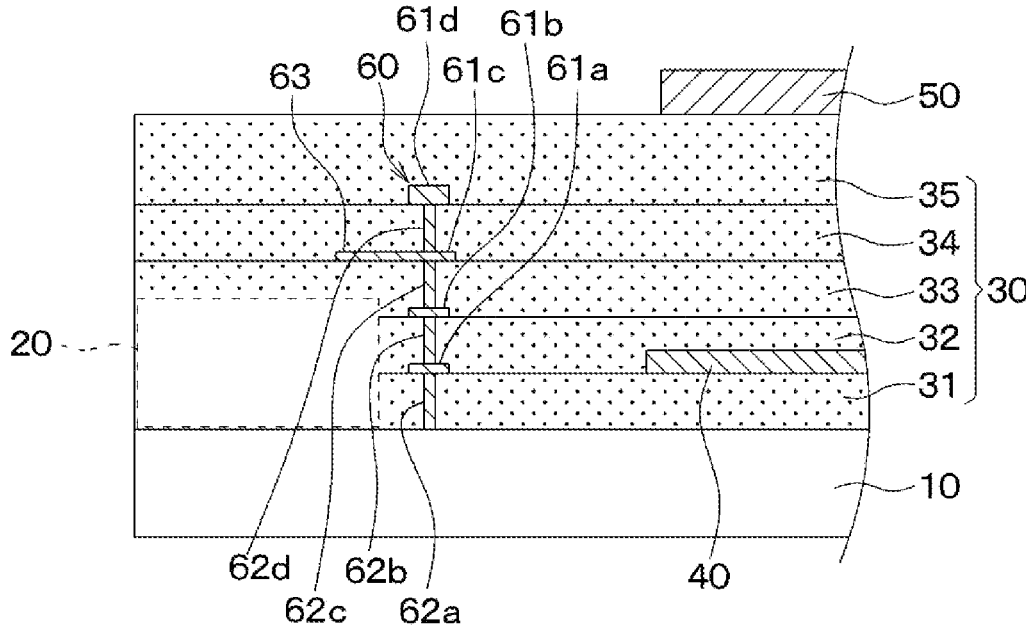
FIG. 6A is a partial cross-sectional view of the signal transmission device when an arrangement of the eaves part is changed, which will be described in a modification of the first embodiment.
Figure 6B:
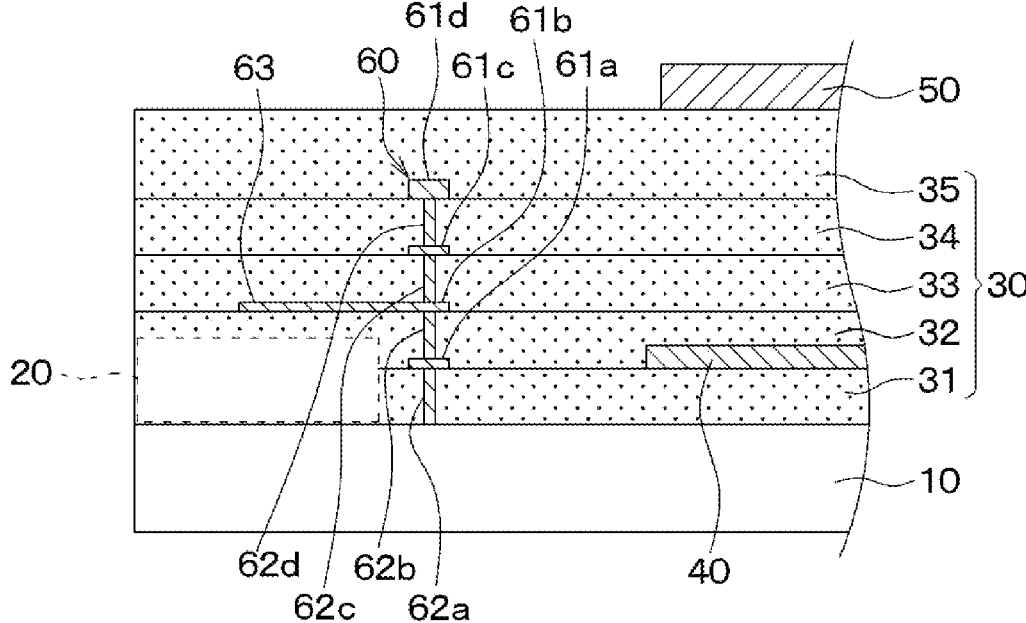
FIG. 6B is a partial cross-sectional view of the signal transmission device when an arrangement of the eaves part is changed, which will be described in a modification of the first embodiment.
Figure 6C:
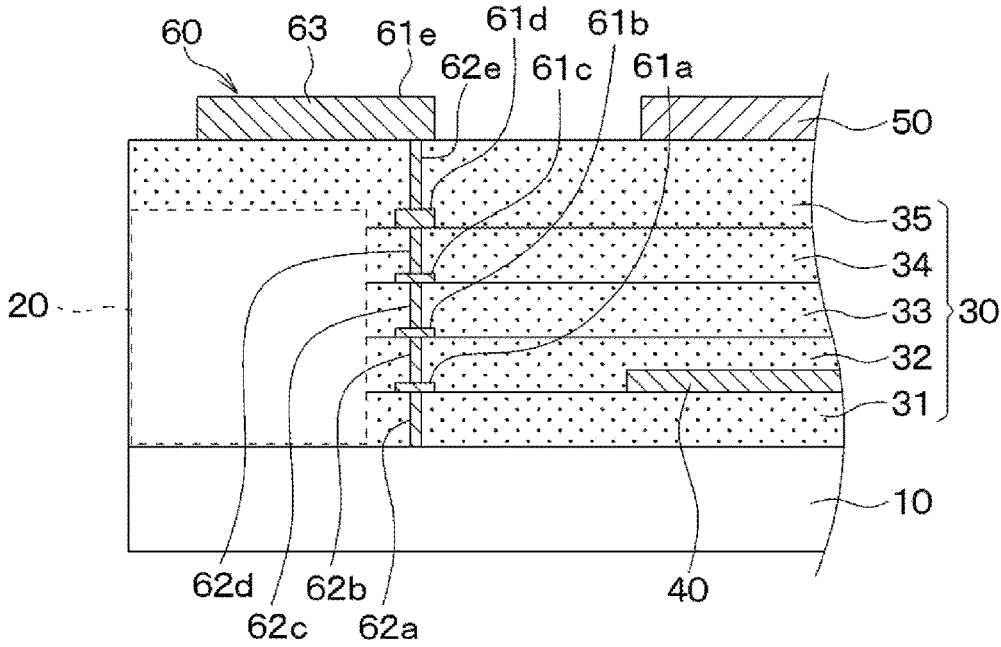
FIG. 6C is a partial cross-sectional view of the signal transmission device when an arrangement of the eaves part changed, which will be described in a modification of the first embodiment.

For example, as shown in FIGS. 6A and 6B, the eaves part 63 may be formed of a conductor 61*b* or a conductor 61*c* that is not located at the highest position. Further, as shown in FIG. 6C, the shield portion 60 is provided with a conductor 61e provided on the surface of the fifth film 35 and a via 62e in which a conductive material is embedded in the via hole formed in the fifth film 35, so that a structure may be adopted in which the shield portion 60 is provided above the outermost surface of the insulating film 30. In such a structure, the eaves part 63 can be formed on the outermost surface of the insulating film 30, as shown in FIG. 6C. When the eaves part 63 is formed on the outermost surface of the insulating film 30, it is possible to suppress the wraparound of a high electric field and also to suppress creeping discharge through the outermost surface of the insulating film 30. Although the eaves part 63 is formed by one of the plurality of conductors 61a to 61e, it is not limited to be formed of one of the conductors 61a to 61e, but may be formed of a plurality of conductors 61a to 61e. In other words, the eaves part 63 may be formed of at least one of the plurality of conductors 61a to 61e.

Second Embodiment

A second embodiment will be described. The present embodiment is a modification in which a layout of the shield portion 60 is changed from the first embodiment, and similar to the first embodiment except the change, so that only portions different from those in the first embodiment will be described.

Figure 7:
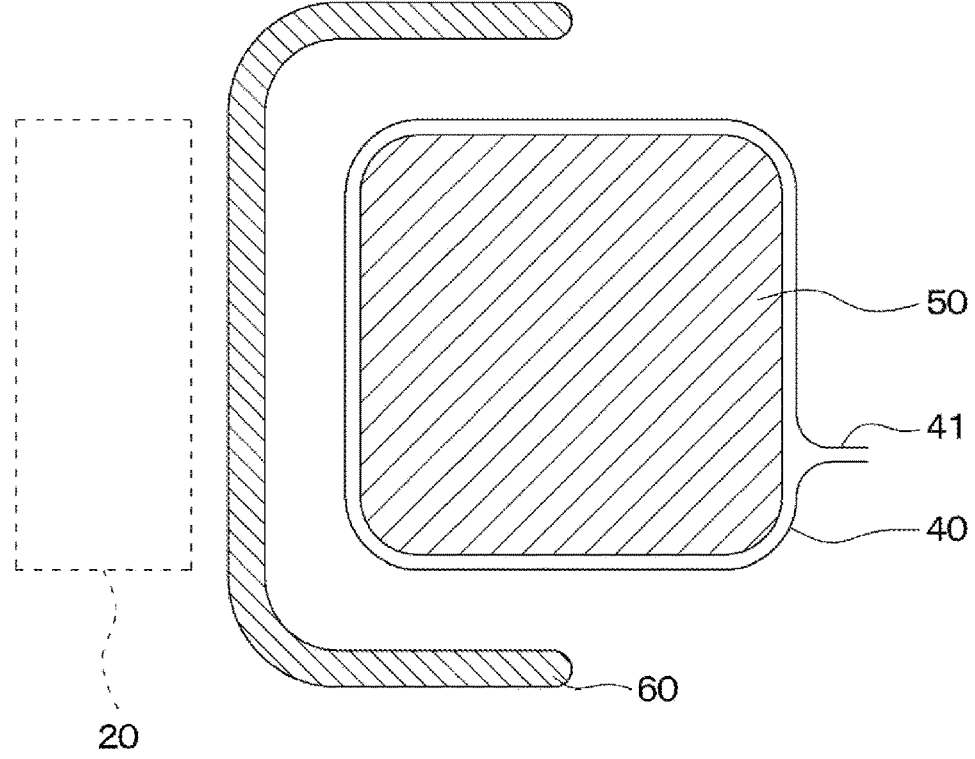
FIG. 7 is a diagram showing a top view of the capacitor coupler and the shield portion in the signal transmission device according to a second embodiment.

As shown in FIG. 7, in the present embodiment, the shield portion 60 is not arranged to surround the entire periphery of the lower electrode 40 and the upper electrode 50, but is formed at a position corresponding to only a part of them.

That is, when the low voltage circuit region 20 is arranged only in a part of the periphery of the lower electrode 40 and the upper electrode 50, the shield portion 60 is placed only between the low voltage circuit region 20 and the lower electrode 40 and the upper electrode 50. In the case of the present embodiment, since the low voltage circuit region 20 is provided along one side of the lower electrode 40 and the upper electrode 50, which have a rectangular shape, the shield portion 60 is disposed between at least one side and the low voltage circuit region 20. In order to prevent the high electric field from passing around the shield portion 60 from the lateral direction and affecting the low voltage circuit region 20, the shield portion 60 is provided opposite to one side and part of two sides adjacent to this one side.

In this way, when the low voltage circuit region 20 is placed in a part of the periphery of the lower electrode 40 and the upper electrode 50, the shield portion 60 may be provided at a position corresponding to only part of the periphery of the lower electrode 40 and the upper electrode 50. Even with such a structure, the same effect as in the first embodiment can be obtained.

Third Embodiment

A third embodiment will be described. The present embodiment is a modification in which a layout of the shield portion 60 is changed from the first embodiment, and similar to the first embodiment except the change, so that only portions different from those in the first embodiment will be described.

Figure 8:
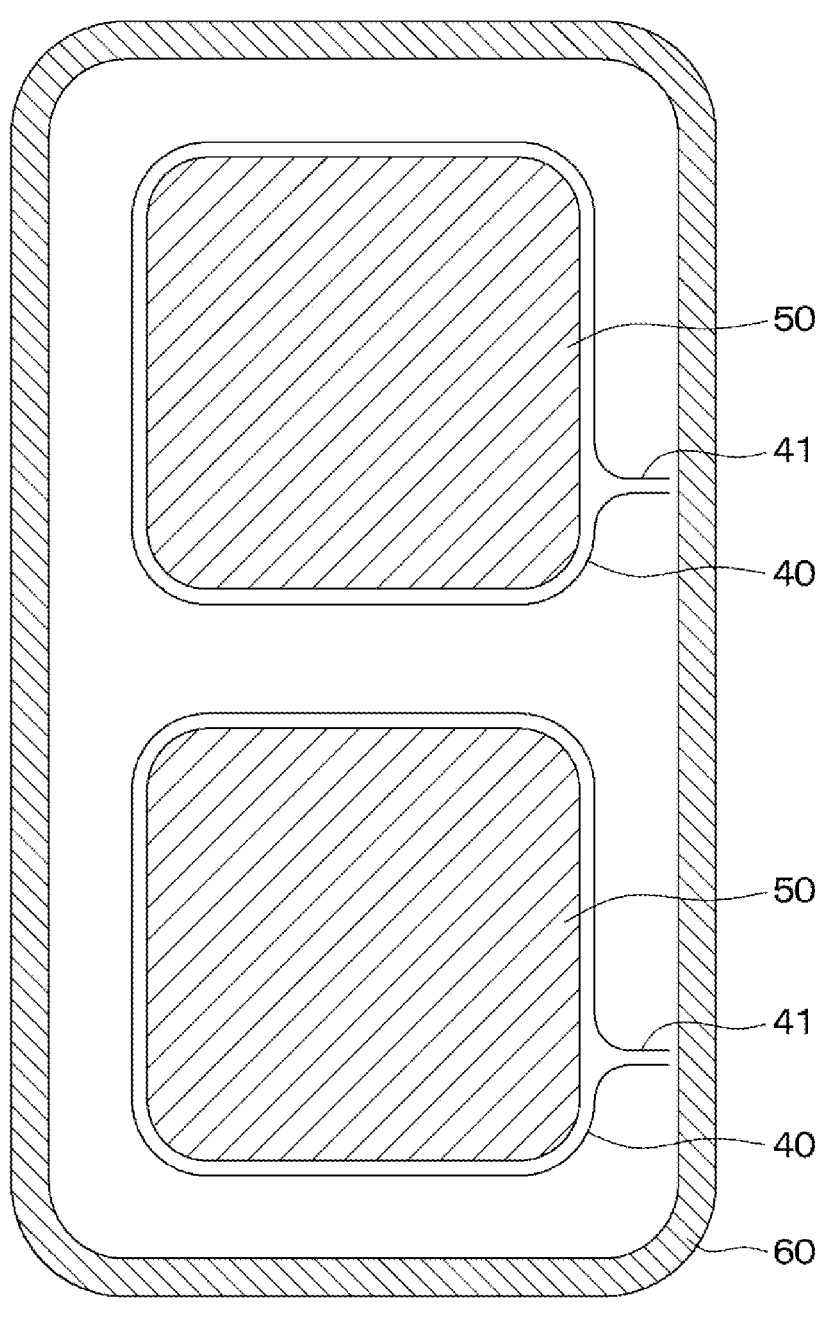
FIG. 8 is a diagram showing a top view of the capacitor coupler and the shield portion in the signal transmission device according to a third embodiment.

In the first embodiment described above, the structure includes one capacitor coupler, but in the case of a structure including two capacitor couplers as shown in FIG. 8, the two capacitor couplers may be surrounded by one shield portion 60.

For example, as for a signal transmission device, two capacitor couplers can be used as one set to transmit one signal. When the signal transmission device is used to control power switching elements for driving a three-phase motor, a total of six power switching elements provided in each of the upper and lower arms of the three phases are controlled. In that case, twelve capacitor couplers would be provided. In such a case, a structure is adopted in which each set of two capacitor couplers used for signal transmission is surrounded by one shield section 60.

Even if two capacitor couplers are surrounded by one shield portion 60 in this way, the same effects as in the first embodiment can be obtained.

Fourth Embodiment

A fourth embodiment will be described. In the present embodiment, a structure for further suppressing the effects of high electric fields is provided with respect to the first to fifth embodiments, and the remaining configurations are the same as those in the first to fifth embodiments. Therefore, only portions different from the first to fifth embodiments will be described. Here, as in the first embodiment, a case where the structure of the present embodiment is applied to a structure in which the shield portion 60 is arranged so as to surround the entire circumference of the capacitor coupler will be described as an example.

Figure 9:
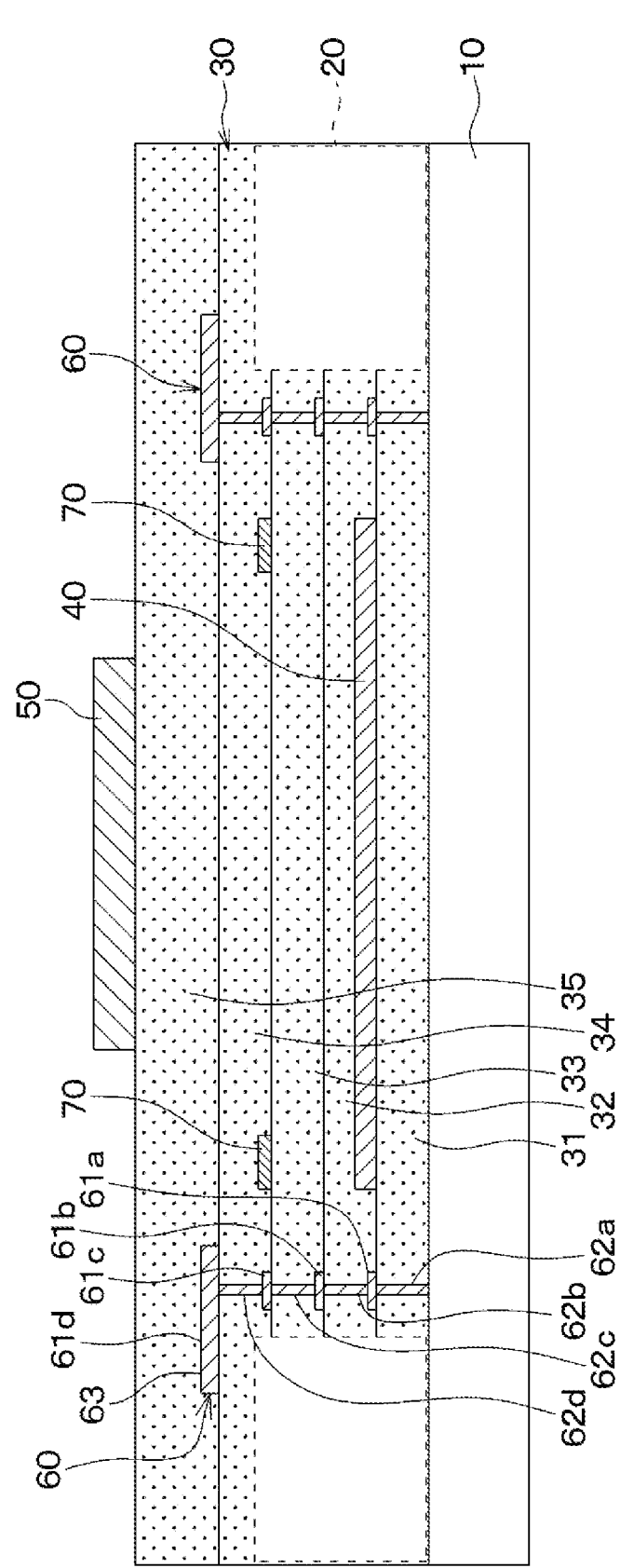
FIG. 9 is a partial cross-sectional view of the signal transmission device according to a fourth embodiment.

As shown in FIG. 9, a float conductor 70 is provided between the lower electrode 40 and the upper electrode 50.

The float conductor 70 is disposed within the insulating film 30, is electrically isolated from the lower electrode 40, the upper electrode 50, and the shield portion 60, and has a float potential. The float conductor 70 is arranged between the lower electrode 40 and the upper electrode 50, that is, at a position of medium height between the height of the lower electrode 40 and the height of the upper electrode 50. Furthermore, the float conductor 70 is disposed between the shield portion 60 and at least one of the lower electrode 40 and the upper electrode 50 in the top view shown in FIG. 10. It is sufficient that the float conductor 70 is formed apart from each of the lower electrode 40 and the upper electrode 50, but it is preferable that the float conductor 70 be formed apart from each of the lower electrode 40 and the upper electrode 50 by a predetermined distance or more. For example, it is preferable that the float conductor 70 is disposed at a distance of 5 μm or more from each of the lower electrode 40 and the upper electrode 50.

Although the thickness of the float conductor 70 is arbitrary, in the present embodiment, the thickness is, for example, approximately the same as that of the lower electrode 40.

Figure 10:
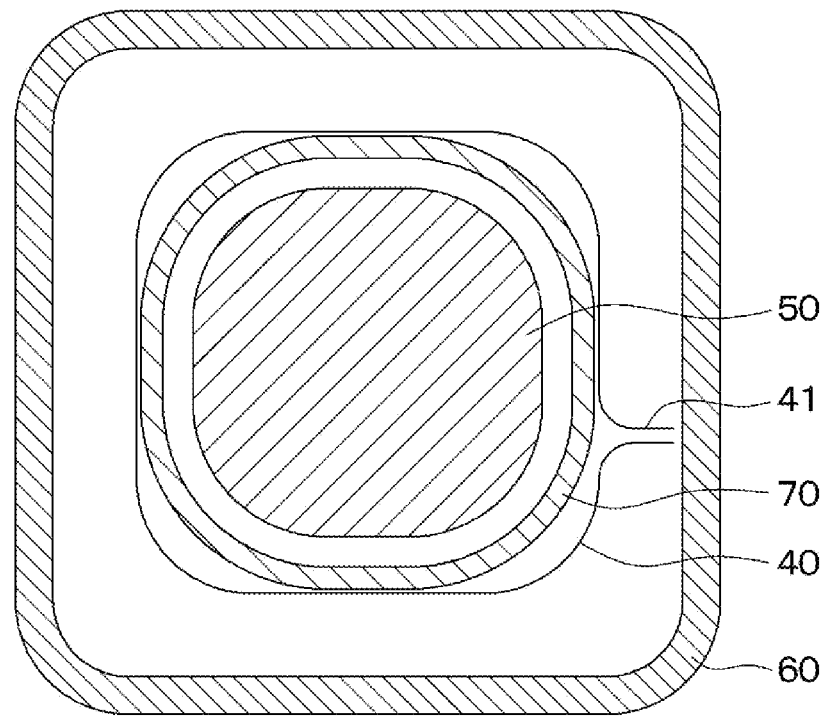
FIG. 10 is a top view of the capacitor coupler, the shield portion, and a float conductor in FIG. 9.

In the case of the present embodiment, the float conductor 70 has a frame shape, and is arranged on an outer side of the smaller of the lower electrode 40 and the upper electrode 50. Specifically, as shown in FIG. 10, the float conductor 70 of the present embodiment has a rectangular frame shape with rounded corners. The width of the float conductor 70, that is, the dimension in the surface direction of the semiconductor substrate 10, is arbitrary. Here, the inner circumferential dimension of the float conductor 70 is larger than the outer circumferential dimension of the upper electrode 50, and the outer circumferential dimension of the float conductor 70 is equal to or larger than the outer circumferential dimension of the lower electrode 40.

In this way, the signal transmission device of the present embodiment includes the float conductor 70. When the float conductor 70 is provided, the float conductor 70 has an intermediate potential between the lower electrode 40 and the upper electrode 50, so that the electric field is also directed to the float conductor 70 side, and the direction of the electric field at the end of the upper electrode 50 to which high voltage is applied is dispersed. Therefore, it is possible to reduce the maximum electric field strength at the end of the upper electrode 50. Therefore, the electric field concentration at the end of the upper electrode 50 is alleviated, the dielectric breakdown due to electric field concentration can be suppressed, and the breakdown voltage can be improved.

Figure 11:
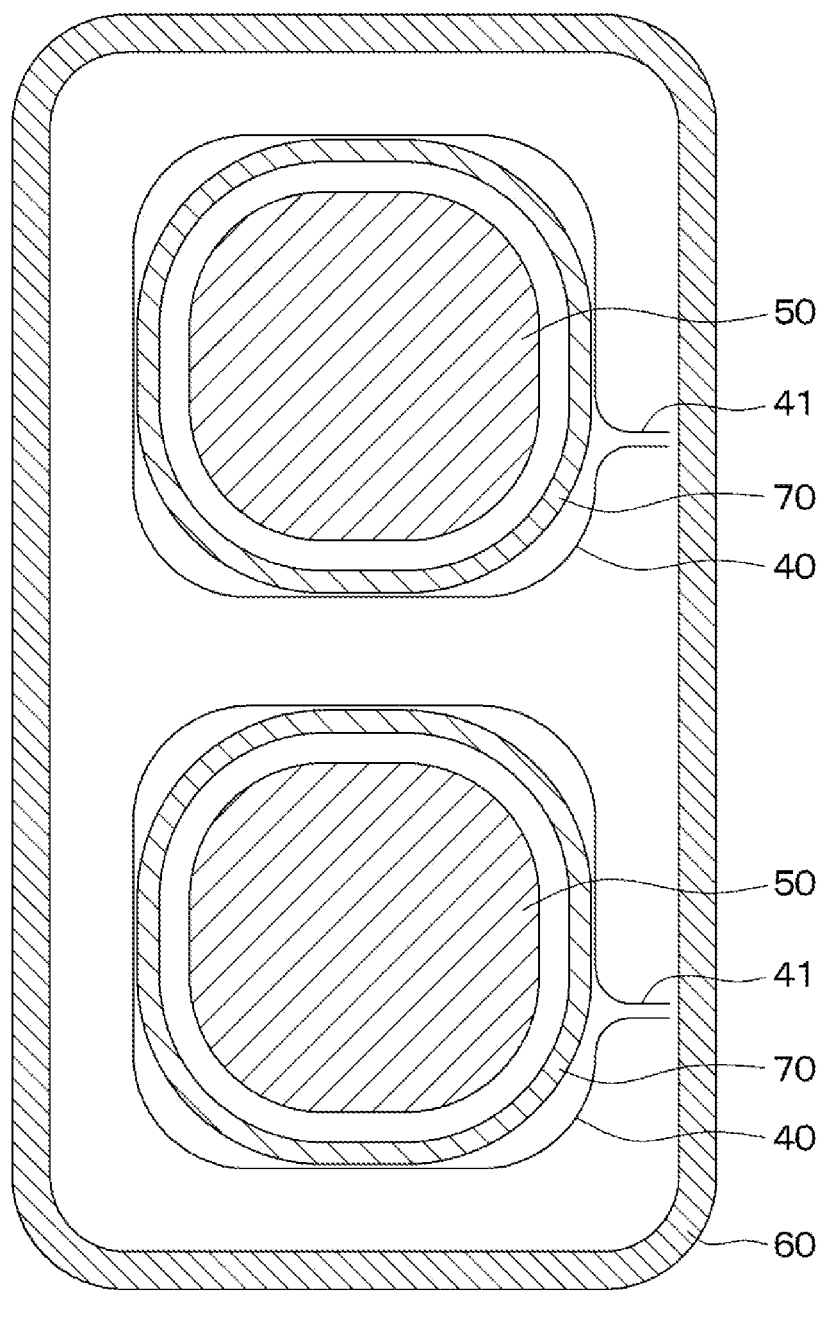
FIG. 11 is a diagram showing a top view of the capacitor coupler, the shield portion, and the float conductor when two capacitor couplers are provided.

Here, as in the first embodiment, a case where the structure of the present embodiment is applied to a structure in which the shield portion 60 is arranged so as to surround the entire circumference of the capacitor coupler will be described as an example. However, it is also applicable to the structure of the second and third embodiments. For example, when two capacitor couplers are provided as in the third embodiment, as shown in FIG. 11, in a top view, the float conductor 70 is arranged to surround at least one of the lower electrode 40 and the upper electrode 50 in each capacitor coupler. Then, both the two capacitor couplers and the two float conductors 70 are surrounded by one shield portion 60. With such a configuration, it can also be applied to the structure of the third embodiment. Although not shown in the second embodiment, the float conductor 70 may be disposed between the capacitor coupler and the shield portion 60 so as to surround at least one of the lower electrode 40 and the upper electrode 50.

Other Embodiments

Although the present disclosure has been described in accordance with the above-described embodiments, the present disclosure is not limited to the above-described embodiments, and encompasses various modifications and variations within the scope of equivalents. In addition, while the various combinations and configurations, which are preferred, other combinations and configurations, including more, less or only a single element, are also within the spirit and scope of the present disclosure.

For example, the dimensional relationship between the lower electrode 40 and the upper electrode 50 described in each of the above embodiments is arbitrary, and the lower electrode 40 and the upper electrode 50 may have the same dimensions, or the upper electrode 50 may be larger than the lower electrode 40. In that case, when forming the float conductor 70 as shown in the fourth embodiment, the float conductor 70 is formed so as to surround at least the smaller of the lower electrode 40 and the upper electrode 50 in the top view. Furthermore, when the lower electrode 40 and the upper electrode 50 have the same dimensions, the float conductor 70 may be formed to surround both of them in the top view.

Further, in each of the embodiments described above, the lower electrode 40 and the upper electrode 50 are formed into a rectangular shape with rounded corners, but they may be formed into other shapes, such as a circular shape or other polygonal shapes.

Further, the first embodiment and its modification may be combined to form a plurality of eaves parts 63 at positions of different heights.

Furthermore, in each of the above embodiments, the conductors 61a to 61e and the vias 62a to 62e are arranged in a straight line in the height direction, but they do not have to be arranged in a straight line. For example, the conductors 61a to 61e and the vias 62a to 62e may be gradually separated from the capacitor coupler as they go higher. Even in that case, the eaves part 63 may be formed by extending only a portion of the conductor away from the capacitor coupler.

Furthermore, in the fourth embodiment, one float conductor 70 is formed for one capacitor coupler, but a plurality of float conductors 70 may be provided for one capacitor coupler. In addition, in the top view, although the float conductor 70 is formed so as to completely surround at least one of the lower electrode 40 and the upper electrode 50 in the capacitor coupler, the float conductor 70 does not have to surround the entire circumference.

The constituent element(s) of each of the above embodiments is/are not necessarily essential unless it is specifically stated that the constituent element(s) is/are essential in the above embodiment, or unless the constituent element(s) is/are obviously essential in principle. A quantity, a value, an amount, a range, or the like referred to in the description of the embodiments described above is not necessarily limited to such a specific value, amount, range or the like unless it is specifically described as essential or understood as being essential in principle. Furthermore, a shape, positional relationship or the like of a structural element, which is referred to in the embodiments described above, is not limited to such a shape, positional relationship or the like, unless it is specifically described or obviously necessary to be limited in principle.

What is claimed is:

1. A signal transmission device having a capacitor coupler, comprising:
   a semiconductor substrate;
   a low voltage circuit region having a control circuit configured to operate based on a reference potential of low voltage formed in the semiconductor substrate;
   an insulating film formed on the semiconductor substrate;
   a lower electrode formed on the semiconductor substrate via the insulating film and to which a control signal from the control circuit is output;
   an upper electrode disposed opposite to the lower electrode via the insulating film interposed therebetween, forming a capacitor together with the lower electrode and to which a high voltage higher than the low voltage is applied; and
   a shield portion formed at least in the insulating film, disposed between the lower electrode and the upper electrode, and the low voltage circuit region, and having a conductor to which a voltage applied in a control circuit operation is applied from the low voltage, wherein
   when a stacking direction of the lower electrode and the upper electrode is defined as a height direction, the shield portion is located higher than the low voltage circuit region and has an eaves part extending on an opposite side with respect to the lower electrode and the upper electrode.

2. The signal transmission device having a capacitor coupler according to claim 1, wherein
   the insulating film has a laminated structure of multiple layers,
   the shield portion includes a plurality of conductors formed alternately with each layer of the insulating film composed of the plurality of layers, and a vias arranged in a via hole formed in each layer so as to connect the conductor and the vias in the height direction, and
   the eaves part is configured by a part of the plurality of conductors extending toward a side opposite to the lower electrode and the upper electrode.

3. The signal transmission device having a capacitor coupler according to claim 2, wherein the eaves part is constituted by the conductor located at the highest position among the plurality of conductors in the height direction.

4. The signal transmission device having a capacitor coupler according to claim 1, wherein the upper electrode is thicker than the lower electrode.

5. The signal transmission device having a capacitor coupler according to claim 1, further comprising:

a float conductor disposed in the insulating film at a height intermediate between the height of the lower electrode and the height of the upper electrode and having a float potential.

6. The signal transmission device having a capacitor coupler according to claim 1, wherein the shield portion is set to a ground potential that is a potential of the semiconductor substrate.

7. The signal transmission device having a capacitor coupler according to claim 1, wherein the eaves part has a width corresponding to a distance from an end nearer to the lower electrode and the upper electrode to an end farthest from the lower electrode and the upper electrode, and the width is 10 μm or more.

8. The signal transmission device having a capacitor coupler according to claim 1, wherein the eaves part has a width corresponding to a distance from an end nearer to the lower electrode and the upper electrode to an end farthest from the lower electrode and the upper electrode and the width is from 20 to 40 μm.

9. The signal transmission device having a capacitor coupler according to claim 1, wherein the shield portion has a shortest distance from the upper electrode of 13 μm or more.

* * * * *